United States Patent [19]

Ohba et al.

[11] Patent Number: 4,809,287
[45] Date of Patent: Feb. 28, 1989

[54] DOUBLE-HETEROSTRUCTURE SEMICONDUCTOR WITH MESA STRIPE WAVEGUIDE

[75] Inventors: Yasuo Ohba, Yokohama, Japan; Miyoko Watanabe, Halifax, Canada; Hideto Sugawara; Masayuki Ishikawa, both of Tokyo, Japan; Yukio Watanabe, Yokohama, Japan; Motoyuki Yamamoto, Kawasaki, Japan

[73] Assignee: Kabushiki Kaisha Toshiba, Kawasaki, Japan

[21] Appl. No.: 83,189

[22] Filed: Aug. 10, 1987

[30] Foreign Application Priority Data

Aug. 8, 1986 [JP] Japan .................. 61-186505
Sep. 26, 1986 [JP] Japan .................. 61-225842

[51] Int. Cl.$^4$ .................. H01S 3/19
[52] U.S. Cl. .................. 372/45; 372/46
[58] Field of Search .................. 372/43–46; 357/17

[56] References Cited

FOREIGN PATENT DOCUMENTS 0258987 12/1985 Japan .................. 372/46

OTHER PUBLICATIONS

Jpn. Journal of Applied Physics, vol. 21, No. 12, pp. L731–L733; Dec. 1982, T. Suzuki et al., "MOCVD-Grown Al$_{0.5}$In$_{0.5}$P-GA$_{0.5}$In$_{0.5}$P Double Heterostructure Lasers Optically Pumped at 90 K".
Appl. Phys. Lett., vol. 45, No. 9, pp. 964–966; Nov. 1984; M. Ikeda et al., "Yellow-emitting AlGaInP double heterostructure laser diode at 77 K grown by atmospheric metalorganic chemical vapor deposition".
Appl. Phys. Lett. 48, No. 2, pp. 89–91; Jan. 1986, M. Ikeda et al., "Room-Temperature Continuous-Wave Operation of an AlGaInP Mesa Stripe Laser".

Primary Examiner—James W. Davie
Attorney, Agent, or Firm—Oblon, Fisher, Spivak, McClelland & Maier

[57] ABSTRACT

Disclosed herein is a double-heterostructure semiconductor laser which emits a laser beam in a visible light range at ambient temperature. An active layer serving as a light emission layer is sandwiched between first and second cladding layers. The first cladding layer comprises an n type InAlP, while the second cladding layer comprises a p type InAlP and has a mesa stripe shape having slanted side surfaces so as to define a light waveguide channel of the semiconductor laser. Current-blocking layers are formed to cover the slanted side surfaces of the second cladding layer. The current-blocking layers comprise GaAs which is a III-V group compound semiconductor different from the III-V group compound semiconductor (i.e., InAlP) comprised in the second cladding layer. The composition ratio of aluminum in the second cladding layer is set not to be less than 0.4, whereby a Shottky barrier serving to inhibit or suppress a current leak in the light waveguide channel of the semiconductor laser is formed between the second cladding layer and the current-blocking layers.

23 Claims, 5 Drawing Sheets

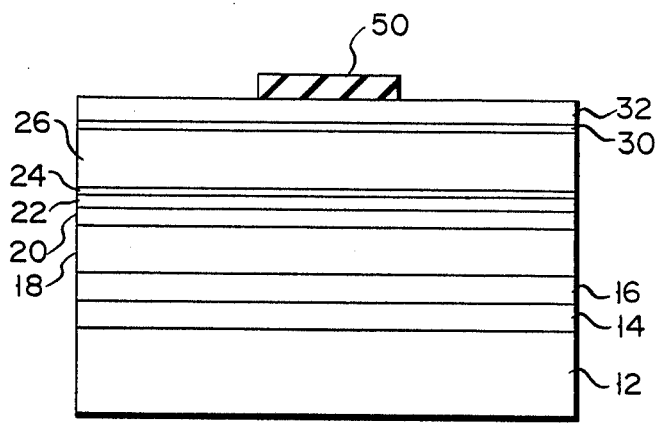
F I G. 3A
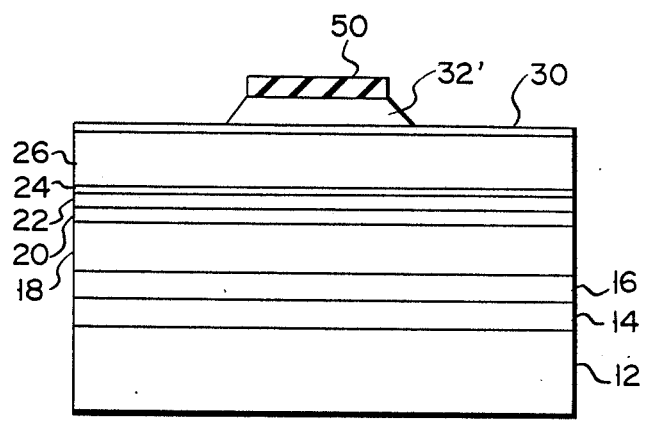
F I G. 3B
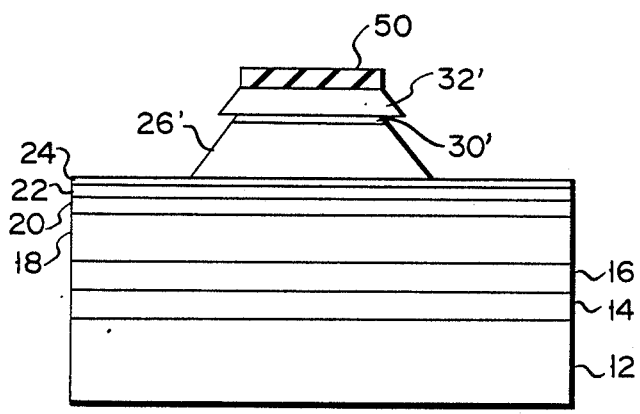
F I G. 3C

DOUBLE-HETEROSTRUCTURE SEMICONDUCTOR WITH MESA STRIPE WAVEGUIDE

BACKGROUND OF THE INVENTION

The present invention relates to a double-heterostructure semiconductor laser, and, more particularly, to a semiconductor laser with a mesa stripe waveguide structure which continuously produces light beams at the ambient temperature in a fundamental transverse-oscillation mode.

Recently, in a technical field of optical data communications or optical information recording, double-heterostructure semiconductor lasers are increasingly receiving attention with regard to their role as a light source that generates an optical information signal. In order to fabricate a multi-layered semiconductor laser, it is necessary to strictly control the re-crystal growth of each semiconductor layer in the manufacturing process of the semiconductor laser so that the re-crystallized layer would have a uniform and high crystal quality. Semiconductor lasers have traditionally been fabricated by a liquid phase epitaxy method or LPE method; however, to more effectively satisfy this requirement, a metal organic chemical vapor deposition method (hereinafter referred to as MOCVD method as it is commonly called so among those skilled in the concerned art) has recently been developed and used instead.

The co-pending U.S. patent application Ser. No. 019,332 filed Feb. 26, 1987 (corresponding EPC Application No. 87301775.0 filed Feb. 27, 1987) proposes a double-heterostructure semiconductor laser, which is fabricated on a GaAs substrate by the MOCVD method and has cladding layers formed of InGaAlp —a new semiconductor material for a laser. In this type of laser, a p conductivity type InGaAlP cladding layer is formed to have a mesa stripe shape defined by two slanted side surfaces. The cladding layer therefore provides a linear projection or rib which defines the mesa-like waveguide channel section of a semiconductor laser. Current-blocking layers of an n conductivity type are provided to partially cover the mesa stripe-shaped cladding layer, and perform current-blocking function for the laser in a visible laser beam emission mode. It is desirable for the cladding layer that the band gap and the hole mobility within the cladding layer are as large as possible. When a mixed crystal semiconductor material is used for the cladding layer, the composition ratio is typically selected to provide a direct transitional band gap. In the disclosed semiconductor laser, the aluminum composition ratio y of the InGaAlP cladding layer is selected to be y<0.35. When y>0.35, the cladding layer is in an indirect transition stage so that an increase in the band gap of this layer becomes significantly gentle and the hole mobility in the cladding layer is reduced. This is not desirable for a laser which uses a pn junction to provide the current-blocking function.

According to the semiconductor laser with the above structure, it is likely to cause a lattice defect at the boundary between the cladding layer and the current-blocking layers (particularly, the boundary at the slanted portions of the mesa stripe-shaped channel). The lattice defect causes current to leak at the pn junction. When the leak current increases in the forward-bias or reverse-bias direction during emission of a laser beam, the current-blocking function of the current-blocking layers becomes insufficiently low, thus degrading the fundamental operation characteristics of the laser, i.e., causing an unstable operation in the laser beam emission mode and/or increasing noise.

SUMMARY OF THE INVENTION

It is, therefore, an object of the present invention to provide a novel and improved semiconductor laser which can improve the fundamental operation characteristics in a continuous oscillation mode.

It is another object of this invention to provide a novel and improved double-heterostructure semiconductor laser which can sufficiently suppress a lattice defect-originated current leak even when a defect occurs in the crystal lattice matching between a cladding layer and current-blocking layers, thus improving the fundamental operation characteristics in the continuous oscillation mode.

In accordance with the above objects, the present invention is addressed to a specific semiconductor device, which emits a laser beam in a visible ray band. The semiconductor laser has a first semiconductive cladding layer of a first conductivity type disposed on a semiconductive substrate of the first conductivity type comprising a III-V group compound semiconductor; an active layer disposed on the first cladding layer and formed by a semiconductor film; and a second semiconductive cladding layer of a second conductivity type disposed on the active layer to provide a double-heterostructure junction. The second cladding layer is formed on the active layer so as to have a mesa stripe shape having slanted side surfaces, thereby defining a light waveguide channel of the semiconductor laser. The second cladding layer comprises a compound semiconductor containing a first III-group element and a first V-group element.

A semiconductive current-blocking layer is formed to cover the slanted side surfaces of the second cladding layer, and is comprised of a compound semiconductor which is different from the compound semiconductor of the second cladding layer and contains a second III-group element and a second V-group element. The second cladding layer further contains aluminum. The composition ratio of aluminum in the second cladding layer is set not to be less than 0.4, whereby a Shottky barrier serving to inhibit or suppress a current leak in the light waveguide channel of the semiconductor laser is formed between the second cladding layer and the current-blocking layer.

When the current-blocking layer is formed to have the opposite conductivity type to that of the second cladding layer, an ordinary pn junction also subsidiarily contributes to sealing current carriers in a mesa stripe channel. When the current-blocking layer is formed to have the same conductivity type as the second cladding layer, the current-blocking layer is integrated with a contact layer to be formed thereon, so that forming an independent current-blocking layer can be omitted.

The present invention and its objects and advantages will become more apparent as a detailed description of preferred embodiments proceeds.

BRIEF DESCRIPTION OF THE DRAWINGS

In the detailed description of a preferred embodiment of the invention presented below, reference is made to the accompanying drawings in which:

FIGS. 3A to 3F are cross-sectional views of multi-layered structures of the laser diode, which are sequentially obtained in the main steps of a manufacturing process of the semiconductor laser diode shown in FIG. 1;

DETAILED DESCRIPTION OF THE PREFERRED EMBODIMENTS

Figure 1:
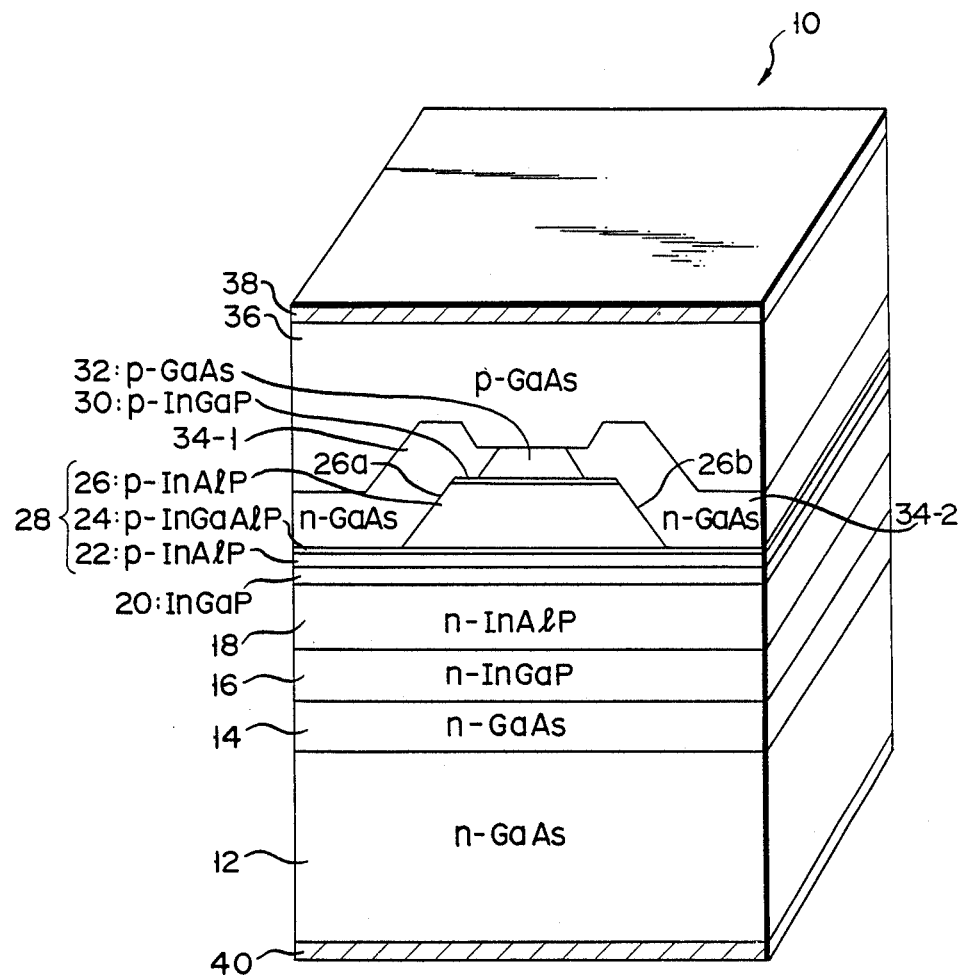
FIG. 1 is a perspective view of a transverse-mode stabilized double-heterostructure semiconductor laser diode in accordance with one preferred embodiment of the invention (not drawn to scale)

There is shown in FIG. 1 of the drawings a transverse mode stabilized double-heterostructure semiconductor laser diode with a mesa stripe waveguide structure, which is designated by reference numeral 10. Laser diode 10 has an n type GaAs substrate 12 of high impurity concentration. On one side of substrate 12 are disposed one above another an n type GaAs buffer layer 14, an n type InGaP buffer layer 16, an n type InAlP cladding layer (first cladding layer) 18, an undoped InGaP active layer 20 serving as a light-emitting layer, a cladding layer unit (second cladding layer) 28 formed of three p type semiconductive layers; namely, InAlP layer 22, InGaAlP layer 24 and InAlP layer 26. First cladding layer 18, active layer 20 and second cladding layer 28 constitute a double-heterostructure in laser diode 10.

The p type InGaAlP layer (referred to as "p-InGaP layer" hereinafter) 24 contains aluminum component at lower composition ratio, as compared with the other p-InAlP layers 22 and 26, to thereby serve as an etching stopper in the manufacturing process of laser diode 10, which will be described in detail later. The p-InAlP layer 26 is formed on layer 24 to have a mesa stripe-shape defined by two slanted side surfaces 26a and 26b. The p-InAlP layer 26 thus provide a linear projection or rib defining a mesa-like waveguide channel section of laser 10.

On the top surface of mesa stripe-shaped cladding layer 26 is formed a thin contact layer 30 made of p-InGaP, on which another p-GaAs contact layer 32 is stacked. Contact layer 32 is formed also in the mesa stripe shape, the width of which is narrower than that of the cladding layer 26. Two p-GaAs layers 34-1 and 34-2 for current-blocking are so formed on cladding layer unit 28 as to cover mesa stripe-shaped cladding layer 26, thin contact layer 30 and mesa stripe-shaped contact layer 32. Only the top surface of contact layer 32 is kept uncovered by current-blocking layers 34. Current-blocking layers 34 are thus in direct contact with the channel side surfaces of stripe-shaped cladding layer 26 and contact layers 30 and 32. Mesa stripe-shaped contact layer 32 and layers 34-1 and 34-2 may serve to carry out the current-blocking function for laser 10.

Contact layer 30 is provided to decrease the electric contact resistivity between cladding layer 26 and contact layer 32. Contact layer 30 is comprised of a certain semiconductive material having a band gap which is larger than that of the overlying contact layer 32 and yet smaller than that of the underlying cladding layer 26. The band gap may be arranged such that it is varied within contact layer 30.

A thick p-GaAs contact layer 36 is further provided to cover current-blocking layers 34 and the top surface of mesa stripe-shaped contact layer 32. Since contact layer 36 is thick, its top surface is formed flat, so that laser diode 10 has a square cross section as a whole. Flat metal layers 38 and 40 are provided on the other surface of substrate 12 and the top surface of the upper contact layer 36 to thereby sandwich the above laser diode structure, as shown in FIG. 1, whereby these metal layers can serve as terminal electrodes therefor.

In the above multi-layered structure of semiconductor laser diode 10, careful attention should be directed to the fact that the second cladding layer 26 and current-blocking layers 34-1 and 34-2 are formed by different semiconductor materials included in the III-V group. To be more specific, second cladding layer 26 contains indium (In) as a III-group semiconductor and phosphorus (P) as a V-group semiconductor; while current-blocking layers 34 contain gallium (Ga) as a III-group semiconductor and arsenic (As) as a V-group semiconductor, with their carrier concentration greater than that of second cladding layer 26. The carrier concentration of second cladding layer 26 is greater than $7 \times 10^{17}$ cm$^{-3}$, and the carrier concentration of current-blocking layers 34 is greater than $1 \times 10^{18}$ cm$^{-3}$ In this embodiment, the carrier concentration of the current-blocking layers is set as high as $2 \times 10^{18}$ cm$^{-3}$. Cladding layer 26 does not contain the same III group semiconductor and V-group semiconductor as current-blocking layers 34. Accordingly, a Schottky barrier is formed between second cladding layer 26 and current-blocking layers 34.

With the chemical formula of cladding layer 26 in the above embodiment expressed as $In_{1-x-y}Ga_xAl_yP$ ($x \geq 0$, $y \leq 1$), the composition ratio y of aluminum in this layer 26 is selected to be:

$$y \geq 0.4 \qquad (1)$$

for example, the composition ratio may be set in a range between 0.4 and 0.5.

The composition ratio x of gallium is selected to be:

$$x = 0 \qquad (2)$$

Figure 2:
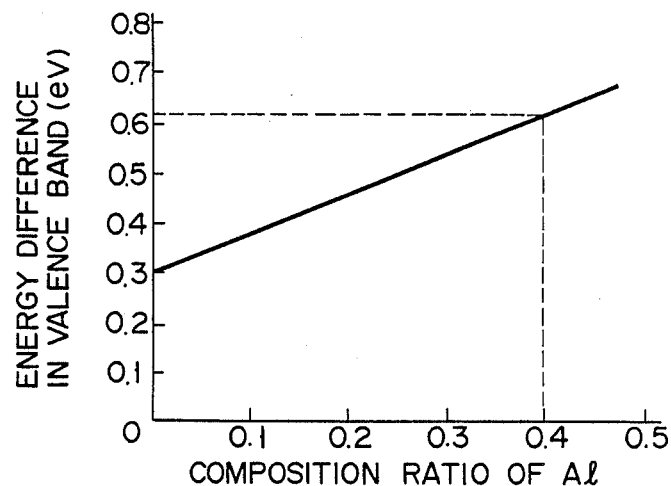
FIG. 2 is a graph showing a characteristic curve of energy difference in valence band between a cladding layer and current-blocking layers vs. composition ratio of aluminum in the cladding layer of the laser diode shown in FIG. 1.

Accordingly, cladding layer 26 is set in an indirect transitional region and has a band gap of about 2.3 electron volts (eV), while current-blocking layers 34 have a band gap of about 1.4 eV. Consequently, in the band structure of laser 10, the energy level difference De (called "energy discontinuous amount" among those skilled in the art) at the valence band between cladding layer 26 and current-blocking layers 34, which has a lower energy than the conduction band, is increased approximately to 0.6 eV or above. As should be obvious from FIG. 2 that shows the measured values plotted, if the composition ratio y of aluminum in cladding layer 26 is selected according to formula (1), the energy level difference De becomes greater than 0.6 eV. In this case, a Shottky barrier with an energy of 0.6 eV or more exists at the boundary between cladding layer 26 and current-blocking layers 34. This barrier is high sufficient to seal current carriers within cladding layer 26, which constitutes the mesa stripe-shaped channel, during the operation of semiconductor laser 10. With the use of the heterostructure junction having such a large band discontinuity for the current blocking purpose, even when crystal mismatch (crystal defect) is present at the boundary between cladding layer 26 and current-blocking layers 34 (particularly, at slanted surface portions 26a and 26b), it is possible to effectively prevent the crystal defect-originated current leak, namely, the leak of holes from cladding layer 26 to current-blocking layers 34 in this embodiment.

According to this embodiment, cladding layer 26 and current-blocking layers 34 have opposite conductivities: cladding layer 26 being of a p type and current-blocking layers 34 of an n type as shown in FIG. 1. According to this embodiment, naturally, a typical pn junction is also formed between cladding layer 26 and current-blocking layers 34. That is, the band gap by the typical pn junction also serves to seal the current carriers within the mesa stripe-shaped channel of semiconductor laser 10. This means desirable strengthening of the current-blocking function.

The fabrication of semiconductor laser 10 with the above-described layer structure will now be explained in detail referring to FIGS. 3A to 3F.

The MOCVD method under a pressure below the atmospheric pressure was performed using methyl-base III-group organic metals (trimethylindium, trimethylgallium, trimethylaluminum) and V-group hydrides (arsine, phosphine) as raw materials. Using this MOCVD method, as shown in FIG. 3A, on one side of n-GaAs substrate 12 (Si dope of $3 \times 10^{18}$ cm$^{-3}$) having a face bearing of (100) were sequentially disposed 0.5 μm thick n-GaAs first buffer layer 14 (Se dope of $3 \times 10^{18}$ cm$^{-3}$), 0.5 μm thick n-InGaP second buffer layer 16 (Se dope of $3 \times 10^{18}$ cm$^{-3}$), 1.0 μm thick n-In$_{0.5}$Al$_{0.5}$P first cladding layer 18 (Se dope of $1 \times 10^{18}$ cm$^{-3}$),and 0.1 μm thick In$_{0.5}$Ga$_{0.5}$P active layer 20. On this layer structure were further sequentially disposed three layers constituting second cladding layer 28, namely, 0.1 μm thick p-In$_{0.5}$Al$_{0.5}$P layer 22 (Mg dope of $1 \times 10^{18}$ cm$^{-3}$), 0.01 μm thick p-In$_{0.5}$Ga$_{0.5}$P layer 24 (Mg dope of $2 \times 10^{18}$ cm$^{-3}$) serving as an etching stopper and 1.0 μm thick p-In$_{0.5}$Al$_{0.5}$P layer 26 (Mg dope of $2 \times 10^{18}$ cm$^{-3}$), 0.01 μm thick p-In$_{0.5}$Ga$_{0.5}$P first contact layer 30 (Mg dope of $2 \times 10^{18}$ cm$^{-3}$) serving as an intermediate contact layer, and 0.5 μm thick p-GaAs second contact layer 32 (Mg dope of $2 \times 10^{18}$ cm$^{-3}$), thereby forming a double-heterostructure wafer. Then, a 5 μm wide and 0.1 μm thick stripe-shaped SiO$_2$ film 50 was formed on second contact layer 32 through pyrolysis of silane gas and photoengraving.

As shown in FIG. 3B, in the subsequent process, with SiO$_2$ film 50 used as a mask, second contact layer 32 was etched using a GaAs selective etchant to expose first contact layer 30, thus forming a 3 μm wide GaAs stripe-shaped mesa 32'.

Then, as shown in FIG. 3C, with GaAs stripe-shaped mesa 32' used as mask, first contact layer 30 was partially etched off using an etchant containing a hydrogen bromide or a hydrogen bromide acid, and first contact layer 30 and cladding layer 26 were etched using an InGaAlP or InAlP selective etchant until cladding layer 24 was exposed, thus forming stripe-shaped mesas (designated by reference numerals "26'" and "30'" in FIG. 3C). Thereafter, if necessary, cladding layer 17 serving as the etching stopper may be removed through an etching process using an etchant containing a hydrogen bromide or hydrogen bromide acid.

Figure 3D:
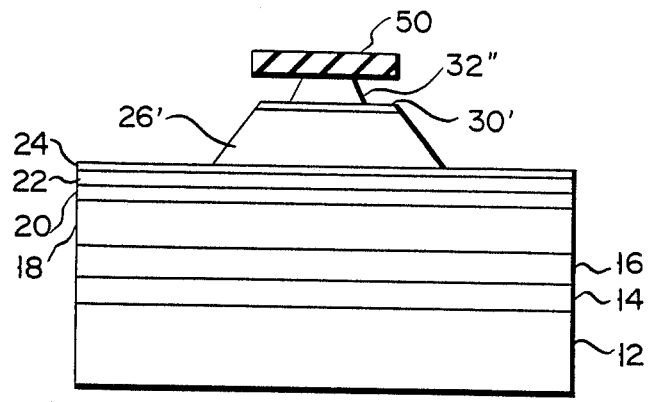

By subjecting the wafer of FIG. 3C to an etching process using a GaAs selective etchant, second contact layer 32' was further etched (or side-etched) to narrower its width, thus forming a narrow stripe-shaped mesa 32'' shown in FIG. 3D. The GaAs selective etchant contained 28% ammonium water, 35% hydrogen peroxide water and water in the ratio of 1:30:9 and was used at the temperature of 20° C. The InGaAlP or InAlP selective etchant was sulfuric acid or phosphorous acid and was used at the temperature of 20° to 130° C.

Figure 3E:
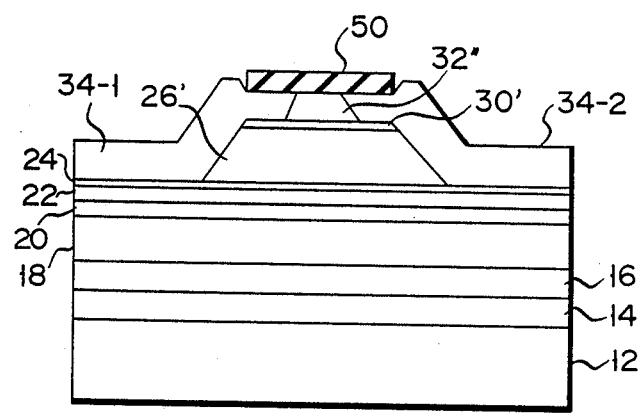

In the subsequent process, as shown in FIG. 3E, current-blocking layers 34-1 and 34-2 (Se dope of $5 \times 10^{18}$ cm$^{-3}$) were formed to be 0.5 μm thick using the MOCVD method under a reduced pressure with trimethylgallium and arsine as raw materials. At this time, the crystal growth was conducted by increasing the temperature up to 830° C. while introducing dilute phosphine gas and then cleaning the InAlP surface after waiting about 5 minutes. Thereafter, the phophine gas fluid was switched to the arsine gas fluid and, after waiting about 1 second, the trimethylgallium organic metal was introduced. As a result, GaAs was not grown at all on SiO$_2$ film 50 and a wafer with the cross section shown in FIG. 3E was attained.

Figure 3F:
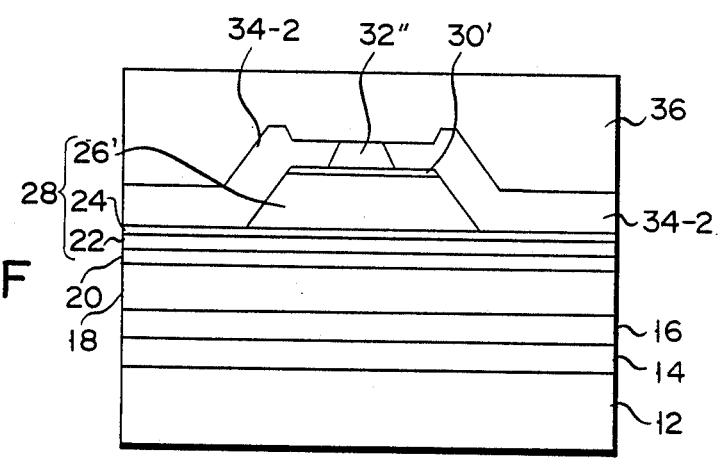

Then, after removing SiO$_2$ film 50, third contact layer 36 (Mg dope of $5 \times 10^{18}$ cm$^{-3}$) with a thickness of 3 μm was formed on the overall surface of the resultant structure as shown in FIG. 3F, using the MOCVD method. Thereafter, Au/Zn electrode 38 and Au/Ge electrode 40 were respectively formed on the top of third contact layer 36 and the bottom of substrate 12, using a well-known electrode-forming process. As a result, a wafer for a laser that has the structure shown in FIG. 1 was attained.

When thus attained wafer was cleaved to prepare a laser element whose oscillator's length is 250 μm, good characteristics with the threshold current of 40 mA and the differential quantum efficiency per surface of 20% was obtained. The optical output linearly increased to 10 mW according to the driving current, which indicates a good current-optical output characteristic without a kink. In addition, images in both the far and near view fields had a single hump, which proved that a proper mode control was executed. Moreover, the oscillation spectrum width W was significantly greater than that of an ordinary semiconductor laser, thus considerably reducing the noise induced by an external reflection light.

Therefore, this embodiment can provide a highly reliable semiconductor laser with a high reproducibility, which can provide the current-blocking structure and light waveguide structure in self-alignment, and have a single basic transverse mode and a low non-point aberration as well as a stable operation under the feedback of a large amount of external reflection light when InGaAlP that is strongly demanded of a light source for an optical information processing, is used. In this case, a significantly high barrier (about 0.7 eV) is formed at the valence band between n-GaAs current-blocking layers 34-1 and 34-2 and p-InAlP cladding layer 26 due to the discontinuity of the valence band and the built-in potential at the pn junction. This can significantly reduce the leak of holes or carriers. Accordingly, even when a good pn junction is difficult to provide and a sufficient current-blocking function cannot be expected by an ordinary heterostructure junction, high current-blocking can be realized by the barrier formed at the p-InAlP valence electron band. This reduces the threshold value and provides a stable mode.

Furthermore, according to the manufacturing method of this embodiment, it is possible to execute the surface cleaning of InAlP and re-growth of GaAs crystal thereon, which are generally difficult to do. To be specific, oxygen is firmly stuck on the surface of InAlP cladding layer 26 that has once been exposed to the atmosphere, so that a well crystal growth of GaAs current-blocking layers 34-1 and 34-2 on that surface of cladding layer 26 cannot be expected. However, by executing the heat treatment under the atmosphere of In and P according to this embodiment, the evaporation of In as well as a V-group element can be effectively suppressed, so that the above difficulty can be eliminated and GaAs current-blocking layers 34-1 and 34-2, which have a good crystal continuity with InAlP cladding layer 26 having a high aluminum composition ratio, can be formed.

Figure 4:
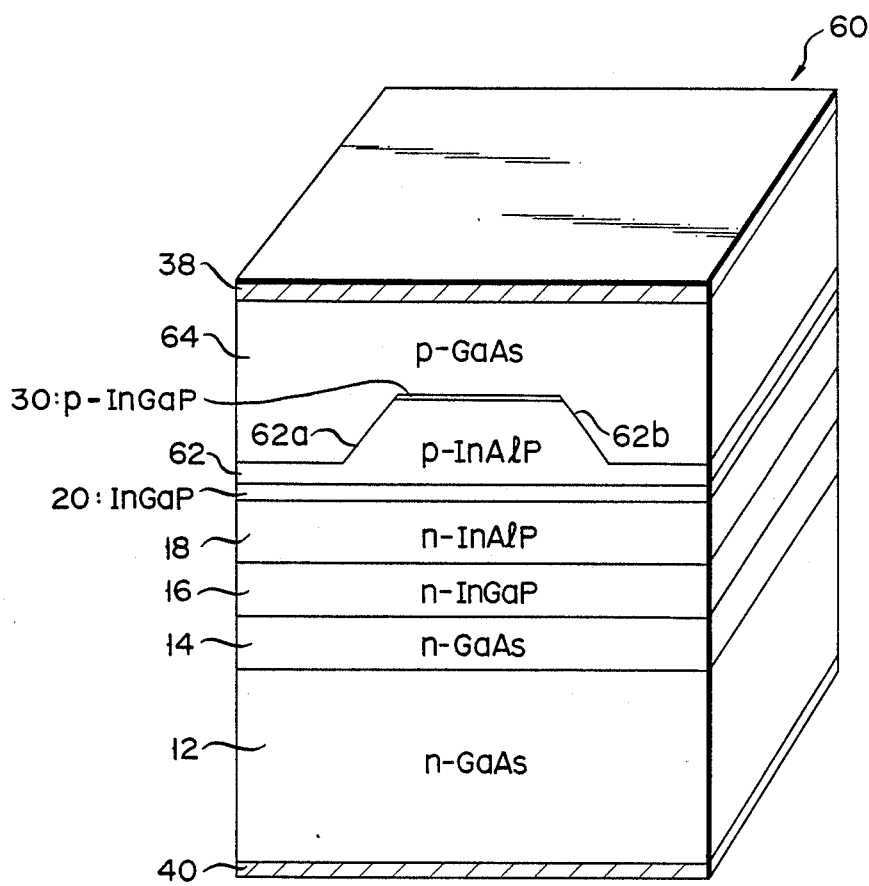
FIG. 4 is a perspective view of a transverse-mode stabilized double-heterostructure semiconductor laser diode in accordance with another embodiment of the invention (not drawn to scale)

FIG. 4 is a perspective view of a double-heterostructure semiconductor laser diode according to another embodiment of this invention, which laser diode is designated by reference numeral 60. The reference numerals used in FIG. 1 are also used in FIG. 4 to denote corresponding layers for diagrammatic simplicity and ease of understanding, and their explanation will be omitted to avoid redundancy. The semiconductor laser diode 60 of FIG. 4 is characterized in its having no current-blocking layers.

A mesa stripe-shaped second cladding layer 62 is formed on undoped InGaP active layer 20 of laser diode 60. This cladding layer 62 comprises a III-V group compound semiconductor, for example, InAlP, whose aluminum composition ratio is increased according to the above-presented inequality (1). Like the cladding layer formed in the first embodiment, cladding layer 62 has two slanted side surfaces 62a and 62b. On the narrowed top surface of cladding layer 62 is disposed p-InGaP contact layer 30. A p-GaAs contact layer 64 is formed to cover both cladding layer 62 and contact layer 30. As no current-blocking layers are provided, second cladding layer 62 is in direct contact with p-GaAs contact layer 64. This layer structure is equivalent to the one obtained by changing the conductivity of current-blocking layers 34 of semiconductor laser 10 shown in FIG. 1 from n type to p type. More specifically, according to the first embodiment of FIG. 1, current-blocking layers 34-1 and 34-2 are GaAs layers that have the opposite conductivity type (n type) to that of second cladding layer 26, while according to the second embodiment of FIG. 4, the current-blocking layers are modified to be formed by GaAs layers that have the same conductivity type (p type) as second cladding layer 62. As a result, the current-blocking layers in the embodiment of FIG. 4 are integrated with p-GaAs contact layer 64. According to the second embodiment shown in FIG. 4, therefore, it is unnecessary to form a re-grown semiconductor layer constituting an independent current-blocking layer at the current path and light waveguide section (i.e., the slanted side surfaces of the mesa stripe channel).

As is the case in the first embodiment of FIG. 1, according to the second embodiment, the sealing of current carriers in the mesa stripe-shaped channel while semiconductor layer 60 is emitting a visible laser beam at the ambient temperature is also carried out using the difference in level (non-ohmic contact) of the Shottky barrier that is increased by the discontinuity of the band gap at the boundary section of the channel. As mentioned earlier, since the conductivity type of the current-blocking layers is changed to p type that is the conductivity type of second cladding layer 62, formation of an independent current-blocking layer can be substantially omitted. Consequently, it is possible to manufacture at a low cost a semiconductor laser (60), which can effectively prevent the current leak in the channel to the degree realized by semiconductor laser 10 of FIG. 1, is highly reliable and has excellent fundamental operation characteristics.

The method for manufacturing the semiconductor laser with the above-described structure will now be explained.

Figure 5A:
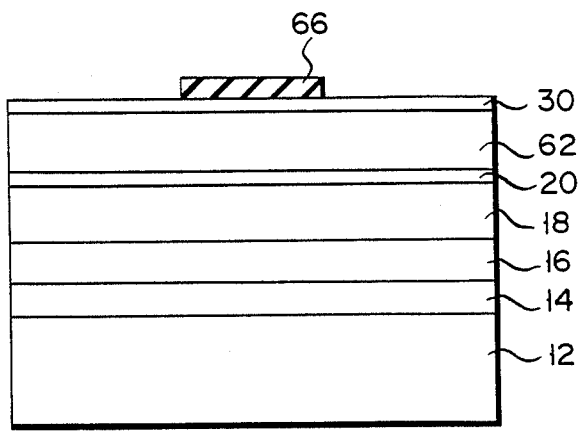
FIGS. 5A to 5C are cross-sectional views of multi-layered structures of the laser diode, which are sequentially obtained in the main steps of a manufacturing process of the semiconductor laser diode shown in FIG. 4.

Using this MOCVD method, as shown in FIG. 5A, on one side of n-GaAs substrate 12 (Si dope of $3 \times 10^{18}$ cm$^{-3}$) having a face bearing of (100) were sequentially disposed 0.5 $\mu$m thick n-GaAs first buffer layer 14 (Si dope of $1 \times 10^{18}$ cm$^{-3}$), 0.5 $\mu$m thick n-InGaP second buffer layer 16 (Si dope of $1 \times 10^{18}$ cm$^{-3}$), 1.0 $\mu$m thick n-In$_{0.5}$Al$_{0.5}$P first cladding layer 18 (Si dope of $1 \times 10^{18}$ cm$^{-3}$), 0.07 $\mu$m thick In$_{0.05}$Ga$_{0.5}$P active layer 20, 1.0 $\mu$m thick p-In$_{0.5}$Al$_{0.5}$P second cladding layer 62 (Mg dope of $1 \times 10^{18}$ cm$^{-3}$), and 0.1 $\mu$m thick p-In$_{0.5}$Ga$_{0.5}$P intermediate contact layer 30 (Mg dope of $1 \times 10^{18}$ cm$^{-3}$), thereby forming a double-heterostructure wafer. Then, a 5 $\mu$m wide stripe-shaped mask layer 66 was formed on the top surface of the wafer through photoengraving.

In the subsequent step, with stripe-shaped mask layer 66 used as a mask, InGaP intermediate contact layer 30 was etched by a liquid mixture of hydrogen bromide acid, bromine and water, thereby forming stripe-shaped intermediate contact layer 30'.

Figure 5B:
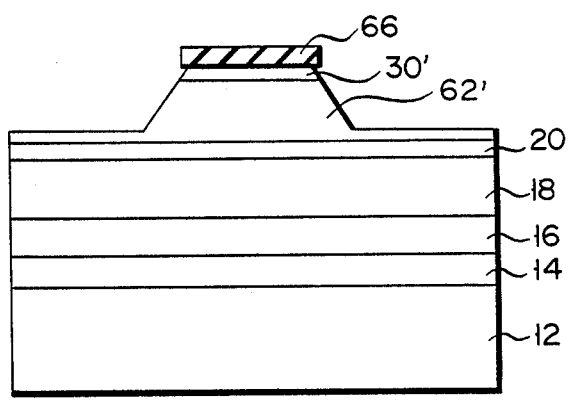

Then, with InGaP stripe-shaped contact layer 30' used as a mask, second cladding layer 62 was half etched by an InGaAlP selective etchant to form a stripe-shaped mesa as shown in FIG. 5B. The InGaAlP selective etchant was sulfuric acid or phosphorous acid and was used at the temperature of 15°-130° C.

Figure 5C:
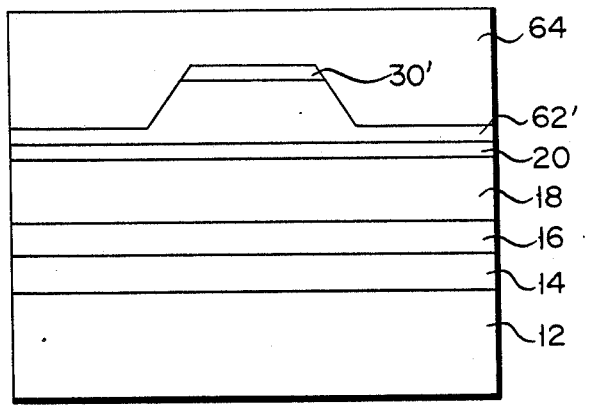

In the subsequent step, after removing stripe-shaped mask 66, an organic compound of a phosphorous hydride and In was introduced in the growing chamber and the wafer was heated to about 800° C. and held at this temperature under the evaporation atmosphere of phosphorous and In, thereby removing the surface oxidized film. Then, as shown in FIG. 5C, p-GaAs contact layer 64 (Mg dope of $1 \times 10^{18}$ cm$^{-3}$) was formed on the overall surface of the resultant structure to be 3 $\mu$m thick using the MOCVD method.

Thereafter, a Au/Zn electrode and an Au/Ge electrode were formed respectively on the top surface of contact layer 64 and the bottom surface of substrate 12 by a well-known electrode-forming process, thus providing the wafer for a laser that has the structure shown in FIG. 1.

When thus attained wafer was cleaved to prepare a laser element whose oscillator's length is 250 $\mu$m, good characteristics with the threshold current of 90 mA and the differential quantum efficiency per surface of 20% was obtained. The optical output linearly increased to 10 mW according to the driving current, which indicates a good current-optical output characteristic without a kink. In addition, images in both lthe far and near view fields had a single hump, which proved that a proper mode control was executed.

According to the second embodiment, a semiconductor laser having the current-blocking structure including InGaAlP and the light waveguide structure can easily be prepared without using a special measure, such as a selective layer formation. This semiconductor laser is therefore very effective in this respect.

Although the invention has been described with reference to specific embodiments, it shall be understood by those skilled in the art that numerous modifications may be made that are within the spirit and scope of the inventive contribution.

For instance, although the p-type cladding layer comprises InAlP and the n-type current-blocking layers comprise GaAs in the first embodiment, about the same threshold current was attained when the p-type cladding layer comprises $In_{1-x-y}Ga_xAl_yP$ ($x \geq 0$, $Y \geq 0.35$) and the n-type current-blocking layers comprise GaAlAs. A low noise reduction characteristic with respect to the external reflection light was attained when the p-type cladding layer comprises $In_{1-x-y}Ga_xAl_yP$ ($x \geq 0$, $Y \geq 0.4$).

In addition, the present inventors recently found that since the band discontinuity at the conductive band is small when the p-type cladding layer comprises $In_{1-x-y}Ga_xAl_yP$, the electrons injected into the active layer from the n-type cladding layer leaked into the p-type cladding layer and were recoupled with the holes, thus producing an invalid current that increase the threshold value. In this situation, when $Y \geq 0.4$ in $In_{1-x-y}Ga_xAl_yP$, the cladding layer is in the indirect transitional region so that the recoupling of the electrons and holes is difficult to occur. As a consequence, the invalid current is reduced, thus reducing the threshold value.

According to the first embodiment, p-type second cladding layer 32 is re-etched after p-type cladding layer 26 is etched to form a stripe-shaped rib. However, this re-etching process should not necessarily be carried out. Further, layers 22, 24 and 26 which are p-InGaAlP-based and constitute the second cladding section may be formed by a single layer. Furthermore, p-type first contact layer (intermediate contact layer) 30 should not necessarily be used, and third contact layer 36 may be omitted such that electrodes are directly formed on second contact layer 32.

In the above-described first and second embodiments, the bearing of the stripe is parallel to the crystal axis of [011]; however, this invention can also apply to the case where the bearing of the stripe is [0$\bar{1}$1].

In the second embodiment, the double-heterostructure may be constituted by InGaAlP and the intermediate contact layer may use $In_{1-x-y}Ga_xAl_yP$ ($0 \geq Y \geq 0.4$). Further, the contact layer may also use GaAlAs.

This invention can apply to a laser which uses other materials than have been described with reference to the preferred embodiments, as long as the combination of the materials has a large band discontinuity.

We claim:

1. A semiconductor laser for emitting a laser beam in a visible light range, comprising:
   (a) a semiconductive substrate of a first conductivity type comprising a III–V group compound semiconductor;
   (b) a first semiconductive cladding layer of said first conductivity type disposed on said substrate;
   (c) an active layer disposed on said first cladding layer and formed by a semiconductor film;
   (d) a second semiconductive cladding layer of a second conductivity type disposed on said active layer to provide a double-heterostructure junction, said second cladding layer having a mesa stripe shape having side surfaces and defining a light waveguide channel of said semiconductor laser, and said second cladding layer comprising a compound semiconductor containing a first III-group element and a first V-group element and aluminum a composition ratio of which is not less than 0.35;
   (e) a semiconductive current-blocking layer formed to cover said side surfaces of said second cladding layer, and comprising a compound semiconductor which is different from said compound semiconductor of said second cladding layer and contains a second III-group element and a second V-group element;
   (f) a first electrode layer provided connected to said substrate; and
   (g) a second electrode layer provided connected to said second cladding layer.

2. The semiconductor laser according to claim 1, wherein the composition ratio of aluminum in said second cladding layer is not less than 0.4.

3. The semiconductor laser according to claim 2, wherein said first III-group element and said first V-group element which constitute said second cladding layer are indium and phosphorus, respectively, and said second III-group element and said second V-group element which constitute said current-blocking layer are gallium and arsenic, respectively.

4. The semiconductor laser according to claim 3, wherein said current-blocking layer has a carrier concentration greater than that of said second cladding layer.

5. The semiconductor laser according to claim 4, wherein said carrier concentration of said current-blocking layer is greater than $1 \times 10^{18}$ cm$^{-3}$.

6. The semiconductor laser according to claim 5, wherein said composition ratio of aluminum in said second cladding layer is set to range between 0.4 and 0.5, whereby a barrier serving to inhibit or suppress a current leak in said light waveguide channel of said semiconductor laser is formed between said second cladding layer and said current-blocking layer.

7. The semiconductor laser according to claim 5, wherein said composition of aluminum in said second cladding layer is set to range between 0.4 and 0.5, whereby said second cladding layer has a band gap of an indirect transitional type so that an increased band gap discontinuity exists between said second cladding layer and said current-blocking layer.

8. The semiconductor laser according to claim 5, wherein said second cladding layer and said current-blocking layer have different conductivity types.

9. The semiconductor laser according to claim 5, wherein said second cladding layer and said current-blocking layer have the same conductivity type.

10. A double-heterostructure semiconductor laser, comprising:
   (a) a semiconductive substrate of a first conductivity type comprising a III–V group compound semiconductor;
   (b) a first semiconductive cladding layer of said first conductivity type disposed on said semiconductive substrate;

(c) an active layer disposed on said first cladding layer and formed by a semiconductor film, said active layer serving as a light emission layer;

(d) a second semiconductor cladding layer of a second conductivity type disposed on said active layer to have a mesa stripe shape having side surfaces, thereby defining a light waveguide channel of said laser, said second cladding layer comprising a compound semiconductor containing a first III-group element, a first V-group element and aluminum with a composition ratio of said aluminum in said second cladding layer being not less than 0.35; and (e) a semiconductor layer formed to cover said side surfaces of said second cladding layer and serving to perform a current-blocking function, said semiconductor layer comprising a compound semiconductor containing a second III-group element and a second V-group element;

(f) a first electrode layer provided connected to said substrate; and (g) a second electrode layer provided connected to said second cladding layer.

11. The semiconductor laser according to claim 10, wherein said composition ratio of aluminum in said second cladding layer is set to range between 0.4 and 0.5.

12. The semiconductor laser according to claim 11, wherein said first III-group element and said first V-group element which constitute said second cladding layer are indium and phosphorus, respectively, and said second III-group element and said second V-group element which constitute said semiconductor layer are gallium and arsenic, respectively.

13. The semiconductor laser according to claim 12, wherein said semiconductor layer has a carrier concentration greater than that of said second cladding layer.

14. The semiconductor laser according to claim 13, wherein said carrier concentration of said semiconductor layer is greater than $1 \times 10^{18}$ cm$^{-3}$.

15. The semiconductor laser according to claim 14, wherein said second cladding layer and said semiconductor layer have different conductivity types.

16. The semiconductor laser according to claim 14, wherein said second cladding layer and said semiconductor layer have a p conductivity type.

17. A double-heterostructure semiconductor laser for emitting a laser beam in a visible light range at the ambient temperature, comprising:

(a) a semiconductive substrate of a first conductivity type comprising a III-V group compound semiconductor;

(b) a first semiconductive cladding layer of said first conductivity type disposed on said substrate;

(c) an active layer disposed on said first cladding layer and formed by a semiconductor film, said active layer serving as a light emission layer;

(d) a second semiconductive cladding layer of a second conductivity type disposed on said active layer to have a mesa stripe shape having side surfaces, thereby defining a light waveguide channel of said laser, said second cladding layer comprising a compound semiconductor containing a first III-group element, a first V-group element and aluminum with a composition ratio of said aluminum in said second cladding layer being not less than 0.35; and (e) a semiconductive contact layer formed to cover said side surfaces of said second cladding layer and serving to perform a current-blocking function, said contact layer comprising a compound semiconductor containing a second III-group element and a second V-group element, whereby a barrier serving to inhibit or suppress a current leak in said light waveguide channel of said semiconductor laser is formed between said second cladding layer and said contact layer;

(f) a first electrode layer provided connected to said substrate; and (g) a second electrode layer provided connected to said second cladding layer.

18. The semiconductor laser according to claim 17, wherein said composition ratio of aluminum in said second cladding layer is set to range between 0.4 and 0.5.

19. The semiconductor laser according to claim 18, wherein said first III-group element and said first V-group element which constitute said second cladding layer are indium and phosphorus, respectively, and said second III-group element and said second V-group element which constitute said contact layer are gallium and arsenic, respectively.

20. The semiconductor laser according to claim 19, wherein said contact layer has a carrier concentration greater than that of said second cladding layer.

21. The semiconductor laser according to claim 20, wherein said carrier concentration of said contact layer is greater than $1 \times 10^{18}$ cm$^{-3}$.

22. The semiconductor laser according to claim 21, wherein said second cladding layer and said contact layer have a p conductivity type.

23. The semiconductor laser according to claim 21, further comprising a compound semiconductor layer provided between said second cladding layer and said contact layer, said compound semiconductor layer comprising plural types of III-group elements and a single V-group element, thereby suppressing a change in band gaps of said second cladding layer and said contact layer and reducing an electric resistance therebetween.

* * * * *